(12) United States Patent
Liu

(10) Patent No.: US 8,456,883 B1
(45) Date of Patent: Jun. 4, 2013

(54) METHOD OF SPIN TORQUE MRAM PROCESS INTEGRATION

(75) Inventor: Daniel Liu, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/482,157

(22) Filed: May 29, 2012

(51) Int. Cl.
| | |
|---|---|
| H01L 21/8239 | (2006.01) |
| G11C 5/08 | (2006.01) |
| G11C 11/15 | (2006.01) |
| H01L 21/8234 | (2006.01) |
| H01L 27/22 | (2006.01) |

(52) U.S. Cl.
CPC ...... H01L 21/823475 (2013.01); H01L 27/228 (2013.01); H01L 27/222 (2013.01)
USPC ............. 365/66; 365/158; 365/171; 257/369; 257/E27.108; 257/E21.665; 257/E21.627; 438/3; 438/200

(58) Field of Classification Search
CPC ............ H01L 21/823475; H01L 27/222; H01L 27/228
USPC ...... 438/3, 200; 257/369, E21.627, E21.665, 257/E27.108; 365/66, 158, 171
See application file for complete search history.

(56) References Cited

U.S. PATENT DOCUMENTS

| | | | |
|---|---|---|---|
| 6,246,082 B1 | 6/2001 | Mitarai et al. | |
| 6,737,283 B2 * | 5/2004 | Morgan | 438/3 |
| 6,784,510 B1 * | 8/2004 | Grynkewich et al. | 257/421 |
| 6,809,951 B2 | 10/2004 | Yamaguchi | |
| 6,890,770 B2 * | 5/2005 | Grynkewich et al. | 438/3 |
| 6,952,360 B2 * | 10/2005 | Morgan | 365/56 |
| 7,042,749 B2 * | 5/2006 | Nejad et al. | 365/63 |
| 7,705,340 B2 * | 4/2010 | Lin | 257/2 |
| 7,884,433 B2 | 2/2011 | Zhong et al. | |
| 8,138,562 B2 | 3/2012 | Mao | |

* cited by examiner

*Primary Examiner* — Evan Pert
(74) *Attorney, Agent, or Firm* — Saile Ackerman LLC; Stephen B. Ackerman; Rosemary L. S. Pike

(57) ABSTRACT

CMOS devices are provided in a substrate having a topmost metal layer comprising metal landing pads and metal connecting pads. A plurality of magnetic tunnel junction (MTJ) structures are provided over the CMOS devices and connected to the metal landing pads. The MTJ structures are covered with a dielectric layer that is polished until the MTJ structures are exposed. Openings are etched in the dielectric layer to the metal connecting pads. A seed layer is deposited over the dielectric layer and on inside walls and bottom of the openings. A copper layer is plated on the seed layer until the copper layer fills the openings. The copper layer is etched back and the seed layer is removed. Thereafter, an aluminum layer is deposited over the dielectric layer, contacting both the copper layer and the MTJ structures, and patterned to form a bit line.

20 Claims, 4 Drawing Sheets

METHOD OF SPIN TORQUE MRAM PROCESS INTEGRATION

(1) TECHNICAL FIELD

This disclosure is related to Magnetic Devices, and more particularly, to methods of integrating Magnetic Devices with semiconductor devices.

(2) BACKGROUND

Magnetoresistive random access memory (MRAM) is one of several new types of random access memory in development that would likely serve as alternatives to the mainstream flash memory design. It maintains a nonvolatile status while retaining the attributes of high speed of reading and writing, high density of capacity, and low consumption of power. The core technology difference between MRAM and other types of nonvolatile random access memory is the method in which it defines and stores digital bits as different magnetic states. Thin magnetic films are stacked in a structure called a magnetic tunnel junction (MTJ) in which the resistance of the MTJ is defined by the relative directions of the magnetic films: parallel or anti-parallel. The variation in electrical current that passes through the two alternating magnetic states of this MTJ structure defines the digital bits ("0" and "1") for MRAM. The memory bit element can be programmed by a magnetic field created from pulse-current-carrying conductors above and below the junction structure. In a newer design of MRAM, a spin transfer switching technique can be used to manipulate the memory element as well. This new design will allow better packing and shrinkage of individual MTJ devices on the wafer, effectively increasing the overall density of the MRAM memory elements.

MRAM devices are often combined with complementary metal-oxide-semiconductor (CMOS) devices. Process integration involves connection between MRAM and CMOS elements without causing any defect related issues.

U.S. Pat. No. 7,884,433 to Zhong et al and U.S. Patent Application 2011/0089507 to Mao, assigned to the same assignee as the present disclosure, and herein incorporated by reference in their entirety, teach methods of MRAM and CMOS integration. U.S. Pat. No. 7,705,340 to Lin discloses MRAM and CMOS devices. U.S. Pat. Nos. 6,809,951 to Yamaguchi and 6,246,082 to Mitarai et al disclose aluminum bit lines.

SUMMARY

It is the primary objective of the present disclosure to provide an improved method for process integration of MRAM and CMOS devices.

It is another objective of the present disclosure to provide an improved method for fabricating MRAM and CMOS devices that maintains or enhances electrical connectivity and test yield.

It is a further objective to provide an improved method for fabricating MRAM and CMOS devices that maintains or enhances electrical connectivity and test yield without potential shorts during fabrication.

In accordance with the objectives of the present disclosure, a method of fabricating a spin-torque-transfer magnetic random access memory device is achieved. CMOS devices are provided in a substrate having a topmost metal layer wherein the topmost metal layer comprises metal landing pads and metal connecting pads. A plurality of magnetic tunnel junction (MTJ) structures are provided over the CMOS devices and connected to the metal landing pads. The MTJ structures are covered with a dielectric layer that is polished until the MTJ structures are exposed. Openings are etched in the dielectric layer to the metal connecting pads. A seed layer is deposited over the first dielectric layer and on inside walls and bottom of the openings. A copper layer is plated on the seed layer until the copper layer fills the openings. The copper layer is etched back and the seed layer is removed where it is not covered by the copper layer. Thereafter, an aluminum layer is deposited over the dielectric layer, contacting both the copper layer and the MTJ structures and patterned to form a bit line.

Also in accordance with the objectives of the present disclosure, a spin-torque-transfer magnetic random access memory device having excellent electrical connectivity and high test yield is achieved. The device comprises CMOS devices in a substrate having a topmost metal layer wherein the topmost metal layer comprises metal landing pads and metal connecting pads. A plurality of magnetic tunnel junction (MTJ) structures overlie the CMOS devices and are connected to the metal landing pads. An aluminum bit line contacts the MTJ structures and contacts copper connections extending downward through a dielectric layer to the metal connecting pads.

BRIEF DESCRIPTION OF THE DRAWINGS

In the accompanying drawings forming a material part of this description, there is shown.

DETAILED DESCRIPTION

The present disclosure is a process integration method of fabricating MRAM devices and especially, high-density spin-transfer torque MRAM (STT MRAM) devices. The process integration method of the present disclosure is designed to make the process flow more cost effective and to maintain or even enhance electrical connectivity and test yields without potential shorts due to etching. In this new scheme, one mask layer and the accompanying lithography and etch step and one chemical mechanical polishing (CMP) step can be avoided, thus achieving better manufacturing throughput and cost.

Figure 1:
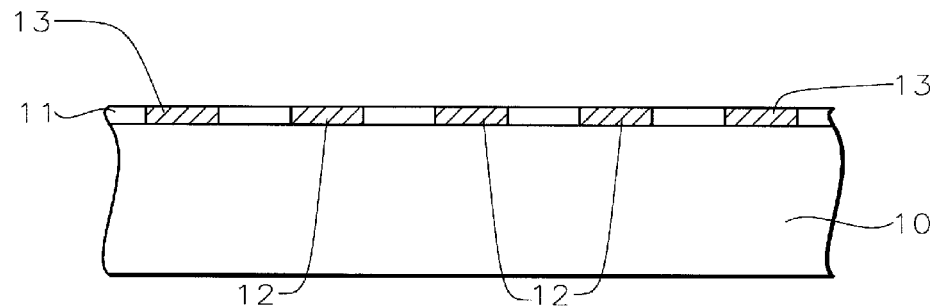
FIGS. 1-9 are cross-sectional representations of steps in a preferred embodiment of the present disclosure.

Referring now more particularly to FIGS. 1-9, the method of the present disclosure will be described in detail. FIG. 1 illustrates a substrate 10. CMOS devices (not shown) are formed within the substrate. The topmost metal level 12/13 of the CMOS device structures is shown, surrounded by dielectric layer 11. The metal layer 12 may be copper, for example. The metal layer will serve as metal landing pads 12 for MTJ junctions or as connecting pads 13 to the CMOS layers.

Figure 2:
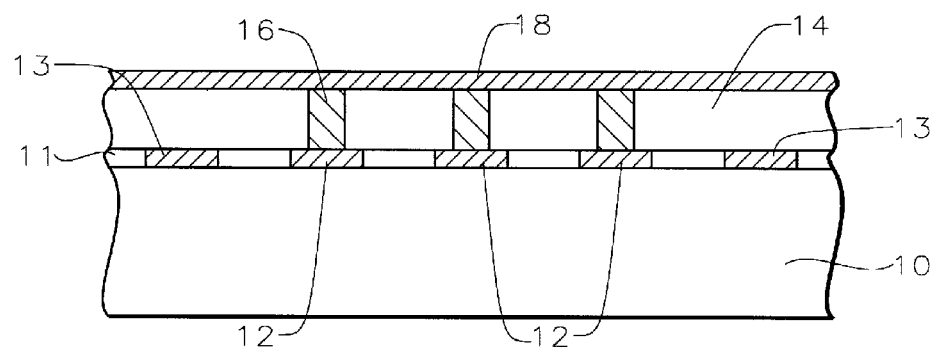

Now, the magnetic RAM layers will be formed over the CMOS layers. As shown in FIG. 2, a dielectric layer 14 is coated over the CMOS metal pads 12. For example, the dielectric material 14 may include a SiCN cap layer. Intermediate via contacts (VAC) 16 are created to the landing pads 12, for example, by a single Cu damascene method. Next, a metal separation layer (VAM) 18 is deposited over the second dielectric layer 14 and VAC's 16 by a physical vapor deposition (PVD) or the like. VAM layer 18 may be a single layer or a composite comprised of one or more of Ta, TaN, or other conductive materials.

Figure 3:
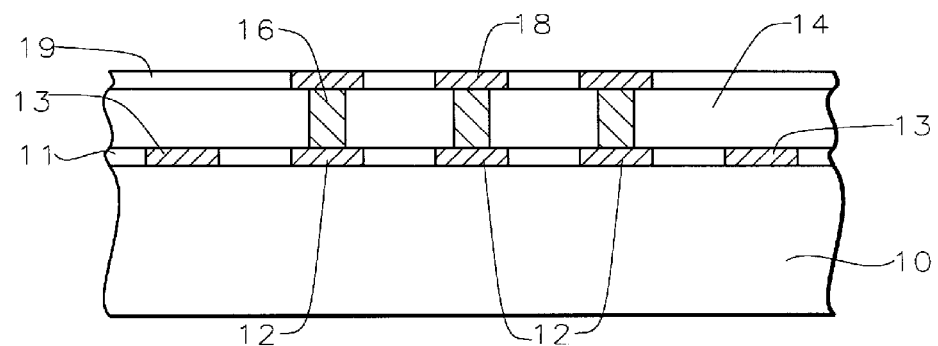

Referring now to FIG. 3, the VAM 18 is patterned to form a plurality of VAM pads in the MRAM device region. From a top view (not shown), the VAM pads may be circular, oval, rectangular, or other shapes and preferably have an area size greater than that of the underlying VAC 16 to ensure that the VAC is completely covered by the VAM pad. Thus, from a side view perspective in FIG. 3, the width of a VAM pad 18 is sufficiently large to cover the underlying VAC 16. A dielectric layer 19 is coated over the VAM pads and planarized, as shown in FIG. 3.

Figure 4:
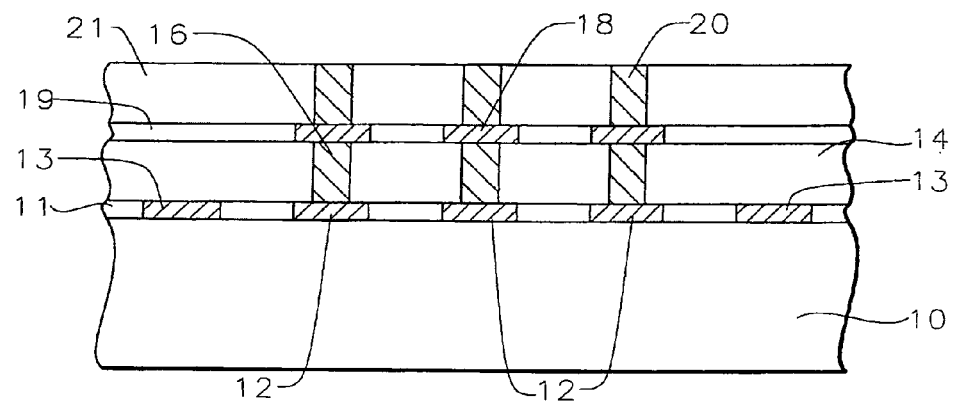

Referring to FIG. 4, an MTJ stack of layers is now formed on the VAM dielectric layer 19 and on VAM pads 18. Individual layers within the MTJ stack are not shown since the present disclosure encompasses a variety of configurations including bottom spin valve, top spin valve, and dual spin valve structures, and so on. Preferably, the MTJ stack has an uppermost capping layer comprised of a hard mask. In one embodiment, the MTJ stack has a bottom spin valve configuration in which a seed layer, AFM layer, synthetic anti-ferromagnetic (SyAF) pinned layer, tunnel barrier layer, free layer, and a composite capping layer made of a hard mask spacer layer and an uppermost hard mask layer are sequentially formed on the VAM dielectric layer 19 and VAM pads 18. The hard mask spacer layer may be NiCr or MnPt and the hard mask layer may be Ta, for example, over the free layer. The metal hard mask may be Ta, Ti, TaN, and the like.

The MTJ stack is patterned by a process that includes at least one photolithography step and one etching step to form a plurality of MTJ elements 20. In an alternative embodiment when two lithography processes are employed to define the MTJ element, a top portion of the MTJ may have a narrower width and smaller area size from a top view than a bottom portion of the MTJ.

A MTJ 20 is formed on each VAM pad 18 and is electrically connected to a CMOS landing pad 12 through a VAM pad 18 and a VAC 16. Although the exemplary embodiment depicts the MTJ 20 as having a width v less than the width w of the VAM pad 18, the present disclosure also encompasses an embodiment where v is greater than or equal to w. The shape of MTJ 20 from a top view perspective may be circular, oval, or other shapes used by those skilled in the art.

Now, a MTJ interlayer dielectric (ILD) layer 21 comprised of a dielectric material such as aluminum oxide, silicon oxide, or a low k material known in the art is deposited on the MTJ 20 array and on the VAM dielectric layer 19 by a PVD method or the like. A CMP process is performed to make the MTJ ILD layer 21 coplanar with MTJ's 20.

Figure 5:
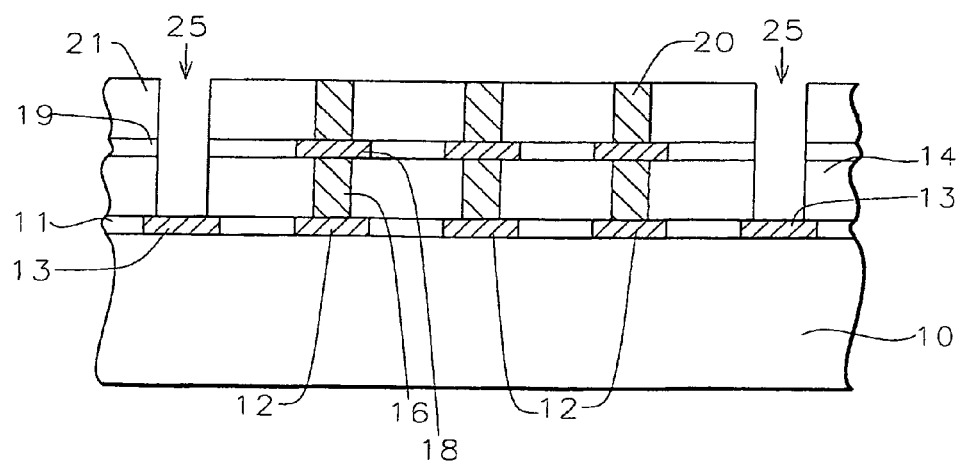
Figure 6:
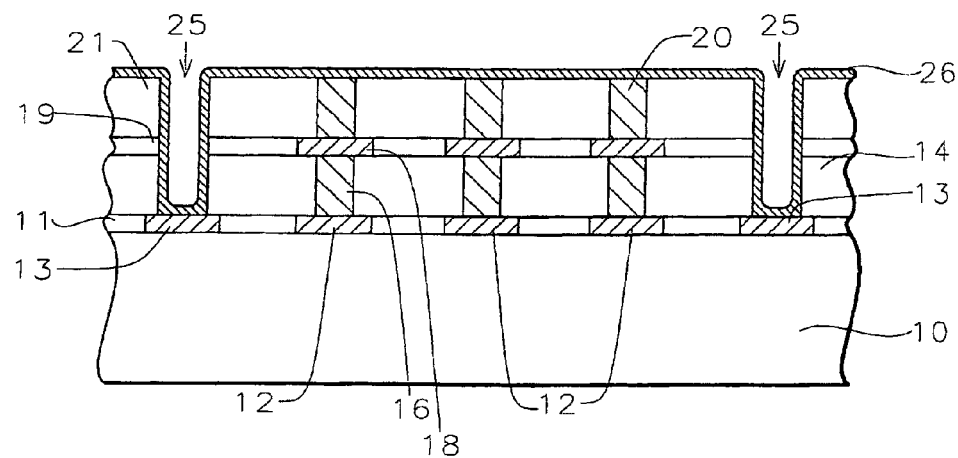

In a key feature of the present disclosure, referring to FIG. 5, a lithographic pattern is formed to provide openings to the CMOS connecting pads 13. The dielectric layers 21, 19, and 14 are etched through to provide openings 25 to the CMOS connecting pads 13. Now, a barrier layer 26 is deposited over the top planarized MTJ layer and conformally within the openings 25, as shown in FIG. 6. The barrier layer 26 is also a seed layer for the subsequent copper deposition. For example, the barrier layer is tantalum, having a thickness of between about 100 and 300 Angstroms, and preferably about 200 Angstroms.

Figure 7:
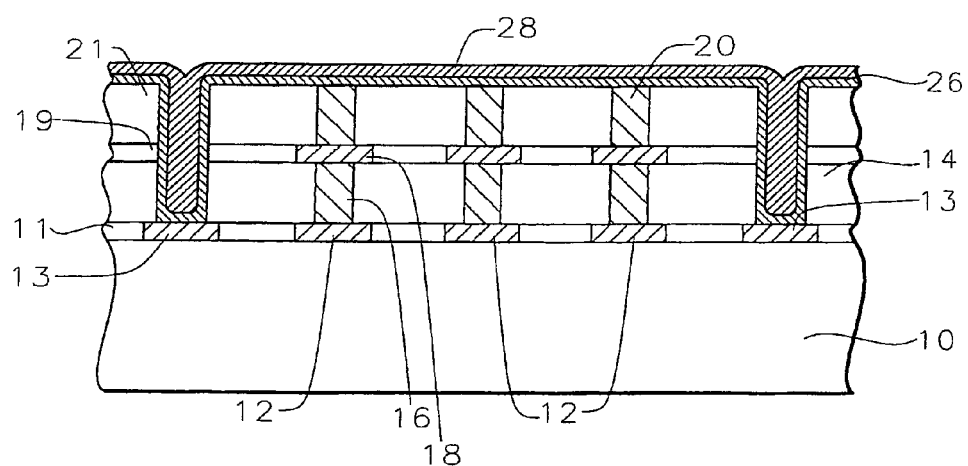
Figure 8:
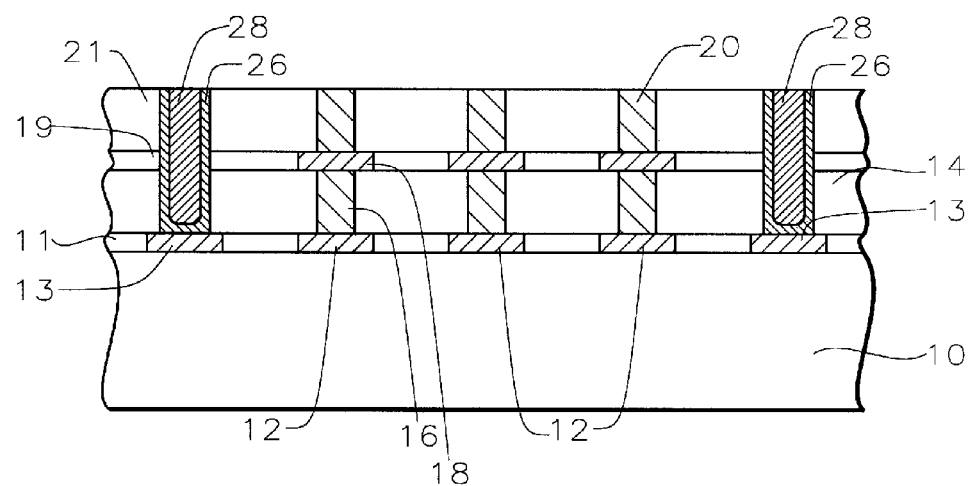

Next, as shown in FIG. 7, copper plating is performed on the seed layer 26. Copper 28 is plated to a thickness of between about 0.28 and 0.5 microns, and preferably about 0.3 microns, just enough to ensure that the via for the bit line (MTV) is filled.

An etch back is performed to remove the copper overlying the barrier layer 26, using layer 26 as an etch stop, and typically using wet chemistry. For example, an etch time of about 132 seconds will remove approximately 1450 Angstroms of copper. Finally, the seed layer 26 is removed where it is not covered by the copper, resulting in FIG. 8. The seed layer may be removed, for example, by a reactive ion etching (RIE) process.

Figure 9:
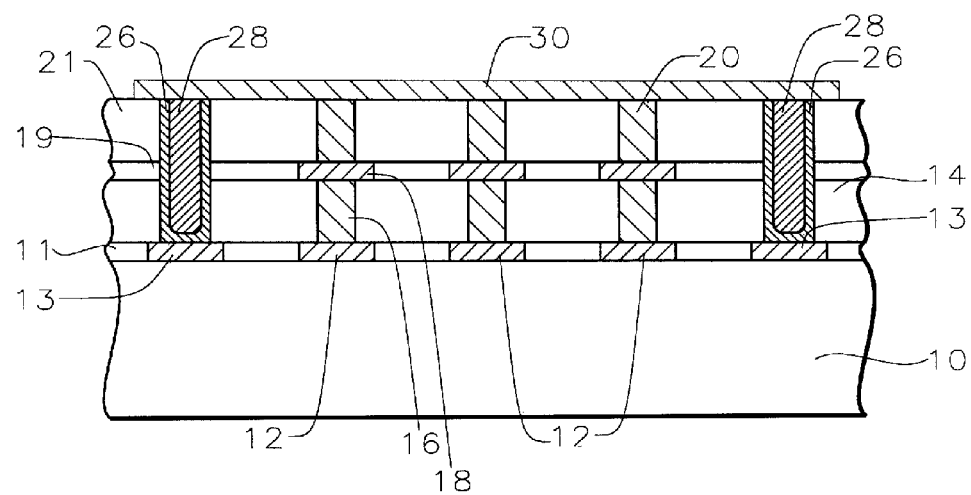

After Cu etch back and seed removal, the bit line will be formed. In the present disclosure, the bit line is formed of aluminum instead of copper. The aluminum thickness should be about three times the thickness of a copper bit line in order to have the same resistivity performance. For example, the aluminum layer is deposited to a thickness of between about 4000 and 8000 Angstroms. The aluminum layer is etched to form bit line 30, contacting the MTJ 20 array and the MTV connections 30, as illustrated in FIG. 9.

A key feature of the present disclosure is to first use a lithography and etching process to provide an opening to the CMOS devices, next deposit a seed layer, plate copper into the opening, and etch back to form the connection between the CMOS metal layer and the bit line, and finally, to form the bit line by deposition and etching. The bit line contacts the MTJ elements and the connections to the CMOS metal. Etching to form the opening to the CMOS metal layer cannot be guaranteed to proceed completely to the metal layer due to the limited end point signal allowed from a low pattern density of openings. Usually, an over etch is performed to ensure that the opening proceeds all the way to the CMOS metal pads. If a dual damascene process were used to form the CMOS connections and the bit line together, there would be a concern that there might be shorts to the MTJ elements due to the over etching.

However, with the process of the present disclosure, the over etch would not result in shorts because the bit line is not formed yet and etching is performed only over the CMOS metal connecting pads and not in the area of the MTJ elements, which are protected by the lithography mask. Thus, as long as the etch opens to the CMOS metal layer, connectivity is always ensured without a concern for shorts. As a result, test yield can be improved.

Another advantage of the aluminum bit line is that there is no corrosion concern with aluminum as there would be with copper. Also, since there is no copper CMP step, uniformity control should be better.

The present disclosure provides a new conceptual idea of process integration flow for spin torque MRAM products. No dual damascene process is needed to form CMOS connection to the bit line. The advantages of the present disclosure include improved bit line connectivity to CMOS layers through MTV vias and better test yield. The process saves a mask layer step and a CMP process step since the connection and bit line do not have to be planarized.

FIG. 9 illustrates the spin-torque-transfer magnetic random access memory device of the present disclosure, having excellent electrical connectivity and high test yield. The device comprises CMOS devices in a substrate 10 having a topmost metal layer wherein the topmost metal layer comprises metal landing pads 12 and metal connecting pads 13. A plurality of magnetic tunnel junction (MTJ) structures 20 overlie the CMOS devices and are connected to the metal landing pads 12, through metal separation pads 18 and intermediate via contacts 16. An aluminum bit line 30 contacts the MTJ structures 20 and contacts copper connections 28 extending downward through a dielectric layer 21/19/14 to the metal connecting pads 13.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a magnetic random access memory device comprising:
   providing CMOS devices in a substrate having a topmost metal layer wherein said topmost metal layer comprises metal landing pads and metal connecting pads;
   providing a plurality of magnetic tunnel junction (MTJ) structures over said CMOS devices and connected to said metal landing pads;
   covering said MTJ structures with a first dielectric layer and polishing said first dielectric layer until said MTJ structures are exposed;
   etching openings in said first dielectric layer to said metal connecting pads;
   filling said openings with a copper layer;
   etching back said copper layer to leave said copper layer only within said openings;
   thereafter, depositing an aluminum layer over said first dielectric layer contacting said copper layer and said MTJ structures; and
   patterning said aluminum layer to form a bit line.

2. The method according to claim 1 wherein said magnetic random access memory device comprises an in-plane or out-of-plane spin-torque-transfer random access memory device, a spin value read head or sensor, or other spintronic device.

3. The method according to claim 1 further comprising:
   depositing a second dielectric layer over said metal contact pads and said metal connecting pads;
   etching via openings through said second dielectric layer to said metal contact pads;
   filling said via openings with a via copper layer; and
   polishing said via copper layer to said second dielectric layer leaving said via copper layer only in said via openings to form copper via connections.

4. The method according to claim 3 further comprising:
   depositing a metal layer over said copper via connections and said second dielectric layer;
   patterning said metal layer to form metal separation pads over said copper via connections; and
   forming said MTJ structures on said metal separation pads wherein said MTJ structures are connected to said metal landing pads through said metal separation pads and said copper via connections.

5. The method according to claim 1, wherein said etching openings in said first dielectric layer to said metal connecting pads further comprises over etching said first dielectric layer until said metal connecting pads are exposed within said openings.

6. The method according to claim 1 wherein said filling said openings with a copper layer comprises:
   depositing a seed layer over said first dielectric layer and on inside walls and bottom of said openings; and
   plating a copper layer on said seed layer until said copper layer fills said openings.

7. The method according to claim 1 wherein said copper layer is plated to a thickness of between about 0.28 and 0.5 microns.

8. The method according to claim 1 wherein said etching back of said copper layer comprises a wet etch chemistry.

9. The method according to claim 1 wherein said aluminum layer has a thickness of between about 4000 and 8000 Angstroms.

10. A method of fabricating a spin torque-transfer magnetic random access memory device comprising:
    providing CMOS devices in a substrate having a topmost metal layer wherein said topmost metal layer comprises metal landing pads and metal connecting pads;
    depositing a first dielectric layer over said metal contact pads and said metal connecting pads;
    etching via openings through said dielectric layer to said metal contact pads;
    filling said via openings with a via copper layer;
    polishing said via copper layer to said first dielectric layer leaving said via copper layer only in said via openings to form copper via connections;
    depositing a metal layer over said copper via connections and said first dielectric layer;
    patterning said metal layer to form metal separation pads over said copper via connections;
    forming a plurality of magnetic tunnel junction (MTJ) structures on said metal separation pads wherein said MTJ structures are connected to said metal landing pads through said metal separation pads and said copper via connections;
    covering said MTJ structures with a second dielectric layer and polishing said second dielectric layer until said MTJ structures are exposed;
    etching openings in said second dielectric layer to said metal connecting pads;
    depositing a seed layer over said second dielectric layer and on inside walls and bottom of said openings;
    plating a copper layer on said seed layer until said copper layer fills said openings;
    etching back said copper layer and removing said seed layer not covered by said copper layer;
    thereafter, depositing an aluminum layer over said second dielectric layer contacting said copper layer and said MTJ structures; and
    patterning said aluminum layer to form a bit line.

11. The method according to claim 10 wherein said spin-torque-transfer random access memory device comprises an in-plane or out-of-plane spin-torque-transfer random access memory device, a spin value read head or sensor, or other spintronic device.

12. The method according to claim 10, wherein said etching openings in said second dielectric layer to said metal connecting pads further comprises over etching said second dielectric layer until said metal connecting pads are exposed within said openings.

13. The method according to claim 10 wherein said seed layer comprises tantalum having a thickness of between about 100 and 300 Angstroms.

14. The method according to claim 10 wherein said copper layer is plated to a thickness of between about 0.28 and 0.5 microns.

15. The method according to claim 10 wherein said etching back of said copper layer comprises a wet etch chemistry.

16. The method according to claim 10 wherein said aluminum layer has a thickness of between about 4000 and 8000 Angstroms.

17. A spin-torque-transfer magnetic random access memory device comprising:
    CMOS devices in a substrate having a topmost metal layer wherein said topmost metal layer comprises metal landing pads and metal connecting pads;
    a plurality of magnetic tunnel junction (MTJ) structures over said CMOS devices and connected to said metal landing pads; and
    an aluminum bit line contacting said MTJ structures and contacting copper connections extending downward through a dielectric layer to said metal connecting pads.

18. The device according to claim 17 wherein said spin-torque-transfer random access memory device comprises an in-plane or out-of-plane spin-torque-transfer random access memory device, a spin value read head or sensor, or other spintronic device.

19. The device according to claim 17 further comprising:
copper via connections on said metal landing pads; and
metal separation pads on said copper via connections wherein said MTJ structures are formed on said metal separation pads and wherein said MTJ structures are connected to said metal landing pads through said metal separation pads and said copper via connections.

20. The device according to claim 17 further comprising a tantalum barrier layer surrounding said copper connections.

* * * * *